(12) United States Patent
Vigoda et al.

(10) Patent No.: US 7,860,687 B2
(45) Date of Patent: *Dec. 28, 2010

(54) ANALOG CONTINUOUS TIME STATISTICAL PROCESSING

(75) Inventors: Benjamin Vigoda, Cambridge, MA (US); Neil Gershenfeld, Somerville, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 55 days.

This patent is subject to a terminal disclaimer.

(21) Appl. No.: 11/738,696

(22) Filed: Apr. 23, 2007

(65) Prior Publication Data
US 2007/0188354 A1 Aug. 16, 2007

Related U.S. Application Data

(63) Continuation of application No. 10/686,009, filed on Oct. 15, 2003, now Pat. No. 7,209,867.

(60) Provisional application No. 60/418,604, filed on Oct. 15, 2002.

(51) Int. Cl.
G06F 9/00 (2006.01)
G06F 7/00 (2006.01)
G06F 17/00 (2006.01)

(52) U.S. Cl. .......................... 702/189; 326/37; 326/39; 326/41; 326/47; 708/100

(58) Field of Classification Search ................. 324/676, 324/683, 709, 710, 76.11, 118, 600, 649, 324/658, 691; 369/30.18, 30.27, 32.01, 33.01, 369/124.01, 24.01, 30.01, 30.03, 99, 100; 702/189, 190, 191, 193, 194, 195, 1, 57, 702/66, 70, 127; 706/22, 15, 16; 708/800, 708/844, 1, 3, 100, 80, 801, 819, 835; 73/866.1; 327/1, 100, 105, 107; 329/300, 304, 372; 330/100, 103, 185; 704/200; 326/37, 38, 326/39, 41, 47

See application file for complete search history.

(56) References Cited

U.S. PATENT DOCUMENTS

| 5,490,074 | A | * | 2/1996 | Agrawal et al. | ............... | 716/16 |
|---|---|---|---|---|---|---|
| 5,530,378 | A | * | 6/1996 | Kucharewski et al. | ......... | 326/41 |
| 5,754,603 | A | * | 5/1998 | Thomas et al. | ............. | 375/367 |
| 5,968,198 | A | * | 10/1999 | Hassan et al. | ............... | 714/752 |
| 6,154,051 | A | * | 11/2000 | Nguyen et al. | ................ | 326/41 |

(Continued)

FOREIGN PATENT DOCUMENTS

EP 0 936 570 A2 * 8/1999

(Continued)

OTHER PUBLICATIONS

Kschischang et al. "Factor Graphs and the Sum-Product Algorithm" IEEE vol. 47 No. 2 pp. 498-519 Feb. 2001.*

(Continued)

*Primary Examiner*—Edward R Cosimano
(74) *Attorney, Agent, or Firm*—Norma E. Henderson

(57) ABSTRACT

Methods for applications such as signal processing, analysis, and coding/decoding replace digital signal processing elements with analog components are implemented by combining soft logic gates and filters, permitting the functionality of complex finite state machines to be implemented.

29 Claims, 10 Drawing Sheets

U.S. PATENT DOCUMENTS

| | | | |
|---|---|---|---|
| 6,282,559 B1* | 8/2001 | Helfenstein et al. | 708/801 |
| 6,467,009 B1* | 10/2002 | Winegarden et al. | 710/305 |
| 6,614,261 B2* | 9/2003 | Ngai et al. | 326/41 |
| 6,894,533 B2* | 5/2005 | Ngai et al. | 326/41 |
| 6,934,342 B1* | 8/2005 | Ishii et al. | 375/316 |
| 6,989,689 B2* | 1/2006 | Ngai et al. | 326/41 |
| 7,042,938 B2* | 5/2006 | Malkov et al. | 375/233 |
| 7,209,867 B2* | 4/2007 | Vigoda et al. | 702/189 |
| 7,317,332 B2* | 1/2008 | Ngai et al. | 326/41 |
| 7,492,188 B2* | 2/2009 | Ngai et al. | 326/41 |
| 2002/0057103 A1* | 5/2002 | Ngai et al. | 326/39 |
| 2003/0053535 A1* | 3/2003 | Malkov et al. | 375/233 |
| 2003/0210073 A1* | 11/2003 | Ngai et al. | 326/41 |
| 2004/0136472 A1* | 7/2004 | Vigoda et al. | 375/316 |
| 2004/0251930 A1* | 12/2004 | Ngai et al. | 326/41 |
| 2007/0030029 A1* | 2/2007 | Ngai et al. | 326/41 |
| 2008/0074143 A1* | 3/2008 | Ngai et al. | 326/41 |
| 2008/0174460 A1* | 7/2008 | Vigoda | 341/118 |
| 2009/0289660 A1* | 11/2009 | Ngai et al. | 326/41 |

FOREIGN PATENT DOCUMENTS

EP        0 936 748 A2 *   8/1999

OTHER PUBLICATIONS

Yedidia et al. "Constructing Free Energy Approximations and Generalized Belief Propagation Algorithms" Misubishi Electrical Research Library pp. 1-44 Apr. 2002.*

Loeliger et al: "Probability Propagation and Decoding in Analog VLSI" IEEE Trans. Information Theory, projected publication Sep. 9, 2000.*

Kschischang et al: "Factor Graphs and the Sum-Product Algorithm", IEEE Trans. Info. Theory 47:498-519 (2001).*

Yedidia et al: "Constructing Free Energy Approximations and Generalized Belief Propagation Algorithms", Mitsubishi Electric Research Laboratory, Apr. 2002.*

* cited by examiner

ANALOG CONTINUOUS TIME STATISTICAL PROCESSING

RELATED APPLICATIONS

This application is a continuation of U.S. patent application Ser. No. 10/686,009, filed Oct. 15, 2003, now U.S. Pat. No. 7,209,867, which claims the benefits of U.S. Provisional App. Ser. No. 60/418,604, filed on Oct. 15, 2002, now expired, the entire disclosures of which are hereby incorporated by reference.

FIELD OF THE INVENTION

The invention relates to the field of signal processing. More particularly, the invention relates to the field of probabilistic analog signal processing.

BACKGROUND

Many methods of digital communication rely on representing binary data with what is inherently an analog signal, an electromagnetic wave. At a transmitter, digital signals originally take the form of a series of squared-off dips and pulses. During transmission of the signal, characteristics of the communication channel over which the signal is sent distort the pulses. On receipt of such a signal, before using the data in the transmission, the receiver must first decipher from the incoming wave what data the sender intended to transmit. Thus, transmitters send symbols encoded as analog signal waveforms, and receivers convert the waveforms back into symbols. An analog-to-digital (A/D) converter in the receiver samples the waveform and outputs a series of binary numbers representing the waveform as a discretized time series. This digital representation is then amenable to signal processing by a digital computer.

Sampling with more bits of resolution preserves more of the information in the received waveform and therefore enables more accurate decoding of its information content by the receiver, but consumes more power and silicon "real estate" in the A/D converter. In general, a higher-resolution digital representation also requires a larger and more powerful digital computer.

Receiving systems have employed two types of A/D converters to guess the intended values of components of incoming signal. In both cases, the converters average the value of the signal over a predetermined period of time. One class of converters compares the magnitude of that average to a threshold. If the magnitude of the averaged sample exceeds the threshold, the converter assumes that the transmitter intended to send a bit representing a one. If the magnitude fails to cross the threshold, the A/D converter assumes that the transmitter intended to send a zero. Basing a guess on a fixed threshold is vulnerable to inaccuracy due to noise and other forms of signal interference. Merely because a sample value falls below, for example, the midpoint between voltage levels corresponding to zero and one does not guarantee that a zero was in fact transmitted.

The second type of A/D converter incorporates the information that can be gleaned from the exact magnitude of a sampled signal. This magnitude is stored as a series of bits (CD players use 10 bits, for example). With this series of bits, the system can use decoding algorithms and digital logic operations representing probabilistic functions to guess the intended value of a received bit with more accuracy than could be done with a thresholding system. Implementing this second approach, however, typically requires the use of thousands of transistors and a relatively large amount of power.

In order to more accurately guess the intended values of a received signal component at a given time point, a receiving system ordinarily synchronizes itself with the incoming data stream. Synchronization prevents the receiving system from attempting to guess the intended value of a signal component over a time in which the intended value of that signal is in transition.

Synchronization has been achieved by the receiver using phase lock loops (PLLs) or by the sender transmitting a synchronization signal along with data. PLLs are typically power-hungry while sending a synchronization signal wastes bandwidth. Accordingly, the power necessary to operate the value guessing and synchronization logic in traditional communications systems tends to require the use of large batteries, frequent recharges, or both.

SUMMARY

In general, the invention relates to continuous-time analog computation, in particular to implementation of statistical signal processing using continuous-time analog circuits. This approach may, for example, be used to replace the discrete-time digital signal processing elements currently in use. The invention can therefore lead to an increase in processing speed and avoids the power usage associated with digital logic. As a result, receiving systems can be built to be much lighter than their digital counterpart systems. Indeed, in some applications (such as semiconductor devices fabricated at an extremely small scale), it may be difficult to avoid recognizing and explicitly handling analog signal attributes.

Beyond this, the invention is applicable to computations intentionally performed on analog signals that do not encode digital information. A generalized operational schematic depicting steps and components utilizable in the method of the invention is depicted in FIG. 11, which steps and components are described in more detail in the paragraphs and sections that follow.

In one aspect, the invention relates to a signal-processing apparatus comprising a plurality of continuous-time delay elements (e.g., filters) for receiving a time-varying signal. Each of the elements imposes a corresponding delay on the signal. A plurality of "soft gates" receive delayed components of the signal from the delay elements. The soft gates each produce an output based on probability distributions associated with different possible states of at least one signal component. In one embodiment, the delay elements are filters, and at least some of the filters are low-pass filters. In other embodiments, at least some of the filters are band-pass filters.

In a further embodiment, the delay elements cause a plurality of temporally distinct signal components to reach a soft gate simultaneously. In yet another embodiment the delay elements are filters that remove high-frequency noise from the signal.

The soft gates may cooperate to effect a series of operations on the signal components. The operations are carried out in a predetermined order mandated by the connections between the gates and the delays imposed by the filters. The predetermined order may correspond to an algorithm, e.g., the belief propagation algorithm (see Yedidia et al., "Constructing Free Energy Approximations and Generalized Belief Propagation Algorithms," Mitsubishi Electric Research Laboratory, April 2002; and Kschischang et al., "Factor Graphs and the Sum-Product Algorithm," *IEEE Trans. Info. Theory* 47:498-519 (2001), both of which are incorporated herein).

The invention may incorporate a receiving module for assigning probability values to different possible states of the signal when it arrives. The receiving module then communicates the probability values to the first of a cascaded series of soft gates that produce outputs based on those probability values.

If the delay elements are used with a limited-bandwidth signal, then the injection of the received continuous-time waveform into the receiver system can lead to synchronization of the receiver system to the transmitter's symbol clock. Accordingly, in still another embodiment, a transmitter having a clock rate produces the received time-varying signal. The delay elements have a bandwidth with an upper bound approximating the frequency of the transmitter's clock rate. The delay elements cooperate with computational elements to synchronize the receiver's computations to the transmitter's clock. For example, the delay elements may be filters having cutoff frequencies no greater than the transmitter's clock rate, which may cooperate with soft gates to synchronize performance of the series of logic operations to the transmitter's clock.

In another aspect, the invention relates to a method of signal-processing that includes the steps of receiving a time-varying signal, imposing a plurality of delays on the signal, and performing state-based operations on a plurality of delayed components of the signal based on probability distributions associated with different possible states thereof. Once again, the order of the state-based operations and the values of the delays can correspond to an algorithm.

In another aspect, the invention relates to a reconfigurable soft circuit and methods for such reconfiguration. The delays imposed by delay elements within the reconfigurable soft circuit can dynamically be altered. Similarly, the functions of the computational elements can also be dynamically altered, and interconnects between calculation elements and delays can also be rearranged. In such a reconfigurable soft circuit, the algorithm performed by the soft gates and filters in the matrix can be reprogrammed dynamically to perform other algorithms without requiring the manufacture of a new device.

Other aspects of the invention related to apparatus for acquiring an encoded time-varying signal having a clock rate and having a plurality of signal components. The signal components each represent one of a discrete set of values. The apparatus include a receiver, a probability module for receiving the signal, and a noise-lock loop including a number of analog delays and analog computational elements. The noise-lock-loop is configured to remove high-frequency noise from the signal and to synchronize the apparatus with the signal. In one embodiment the noise-lock loop of the apparatus also decodes the encoded time-varying signal. In another embodiment, the "apparatus" corresponds to a user and the noise-lock loop operates to detect whether the user is the intended recipient of the time-varying signal.

BRIEF DESCRIPTION OF THE DRAWINGS

The foregoing discussion will be understood more readily from the following detailed description of the invention, when taken in conjunction with the accompanying drawings, in which.

DETAILED DESCRIPTION

The sum-product algorithm (also known as the "belief propagation" algorithm) and its approximations (such as max-product) operate by message passing on a probabilistic graphical model (PGM). A growing number of statistical signal processing algorithms have been shown to be special cases of the sum-product algorithm on a particular PGM. Decoding algorithms, for example, can be described as Bayesian networks using sum-products. Sum product algorithms consist of a series of addition and/or multiplication steps.

Given a function with a discrete number of potential outcomes, a probability function P(X), where X denotes the set of possible outcomes $\{x_1, \ldots, x_m\}$ can be defined such that $\Sigma P(X=x_i)=1$. The probability, therefore, that $P(X=x_i)$ (which can be denoted as $P_x(x_i)$) for each $x_i$ ranges from 0 to 1 (assuming non-negative probabilities). Such a function can be modeled in circuit form by representing probabilities as percentages of a maximum current $I_x$, i.e., $I_{x,i}=I_x P_x(x_i)$ and $\Sigma I_{x,i}=I_x$.

In some embodiments of the invention the sum-product algorithm circuits mentioned above are implemented with analog components; for example, probabilities in the sum-product algorithm are represented by electrical currents or voltages. A probability of an outcome is represented by the fraction of a maximum potential current flowing through a system.

Figure 1:
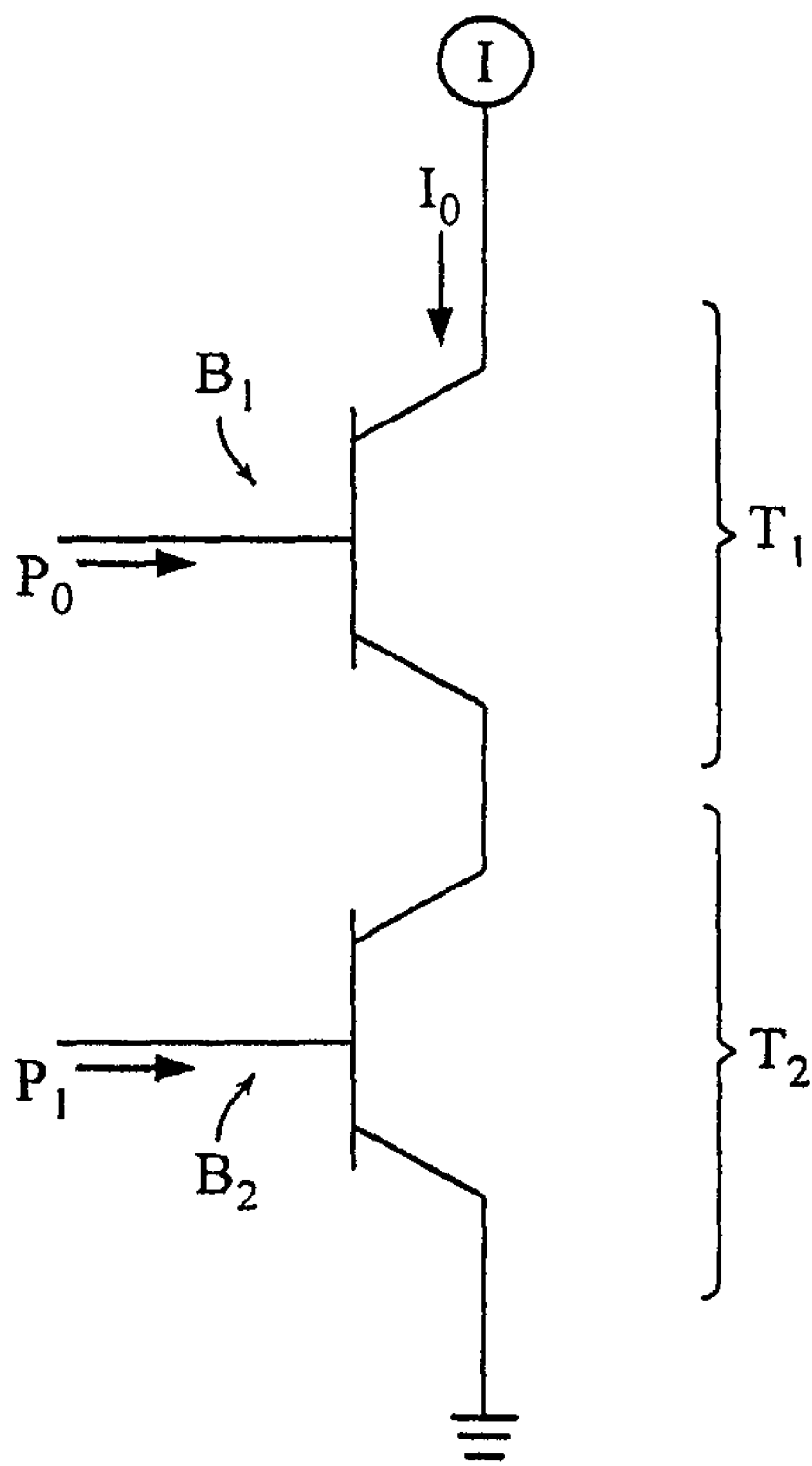
FIG. 1 schematically depicts a simple analog multiplier.

Conceptually, a multiplier can be built with two transistors. If, as in FIG. 1, two transistors, T1 and T2 are connected in series, emitter to collector, with each base, B1 and B2, being fed an input current, $P_0$ and $P_1$, equal to fractions of each of the transistors' saturation levels, the resulting current $I_0$ flowing through the transistors will equal the maximum potential current flow, $I_{max}$, multiplied by the probabilities represented by $P_0$ and $P_1$. (In actuality, a practical circuit would be differential and account for biasing.)

Similarly, joining two wires together sums the current flowing in each. Combining these basic configurations into more complicated arrangements allows the design of a myriad of sum-product functions. Such models can be used to implement functions having any discrete number of potential outcomes.

One embodiment of the invention uses functions that are binary, e.g., XOR and Equals. An XOR gate performs the mod-2 addition function. In a fully digital circuit, the probability that the inputs and output of an XOR gate are 0 or 1 is either 0% or 100% (i.e., $I_{x,1}$=all or no current, $I_{x,0}$=no or all current). With an analog XOR gate, termed a "soft XOR," the probability that the inputs and outputs are either 0 or 1 can range between 0% and 100% with the constraint that the probabilities for any set of corresponding inputs or outputs sum to 100%.

The soft XOR function (z) can be described as follows:

$$P_z(0)=P_x(0)P_y(0)+P_x(1)P_y(1)$$

$$P_z(1)=P_x(0)P_y(1)+P_x(0)P_y(1)$$

Figure 2:
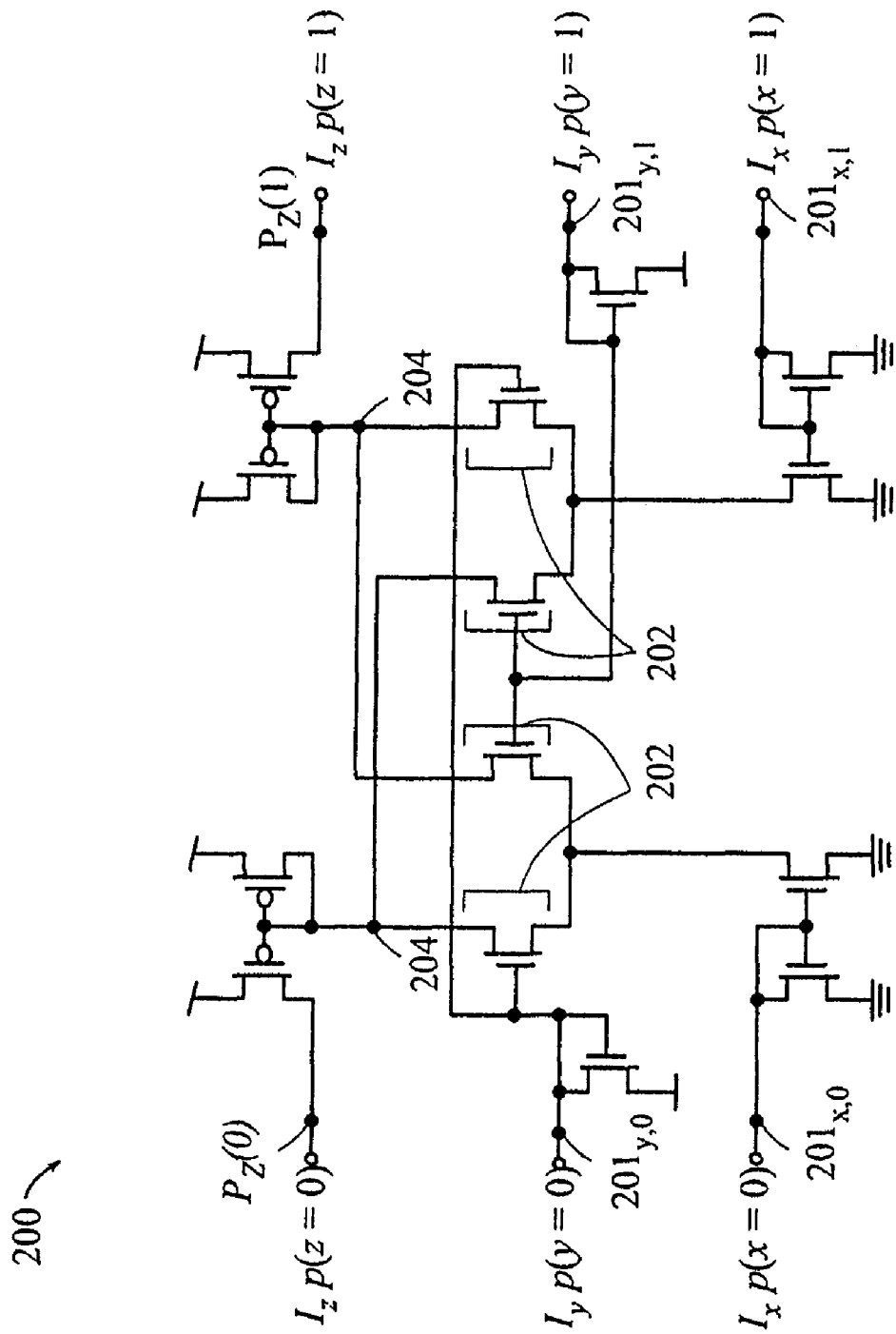
FIG. 2 schematically depicts an implementation of a soft XOR gate.

FIG. 2 illustrates a conceptual circuit diagram for implementing a soft XOR 200. The gate takes as inputs the probabilities that two signal components, x and y, equal zero or that they equal 1. A series of current sources $201_{y,0}$, $201_{x,0}$, $201_{y,1}$, $201_{x,1}$ provide a maximum current of $I_{max}$. The transistors in the center of the diagram 202 carry out the necessary multiplication steps. The transistors 202 multiply $P_x(0) \times P_y(0) \times I_{max}$; $P_x(1) \times P_y(1) \times I_{max}$; $P_x(0) \times P_y(1) \times I_{max}$; and $P_x(0) \times P_y(1) \times I_{max}$. The wire junctions 204 carry out the summation functions: $P_x(0)P_y(0)I_{max}+P_x(1)P_y(1)I_{max}$, and $P_x(0)P_y(1)I_{max}+P_x(0)P_y(1)I_{max}$. The outputs, $P_z(0)$ and $P_z(1)$ are equal to the result of the summations, matching the mathematical representation of the soft XOR gate.

Figure 3:
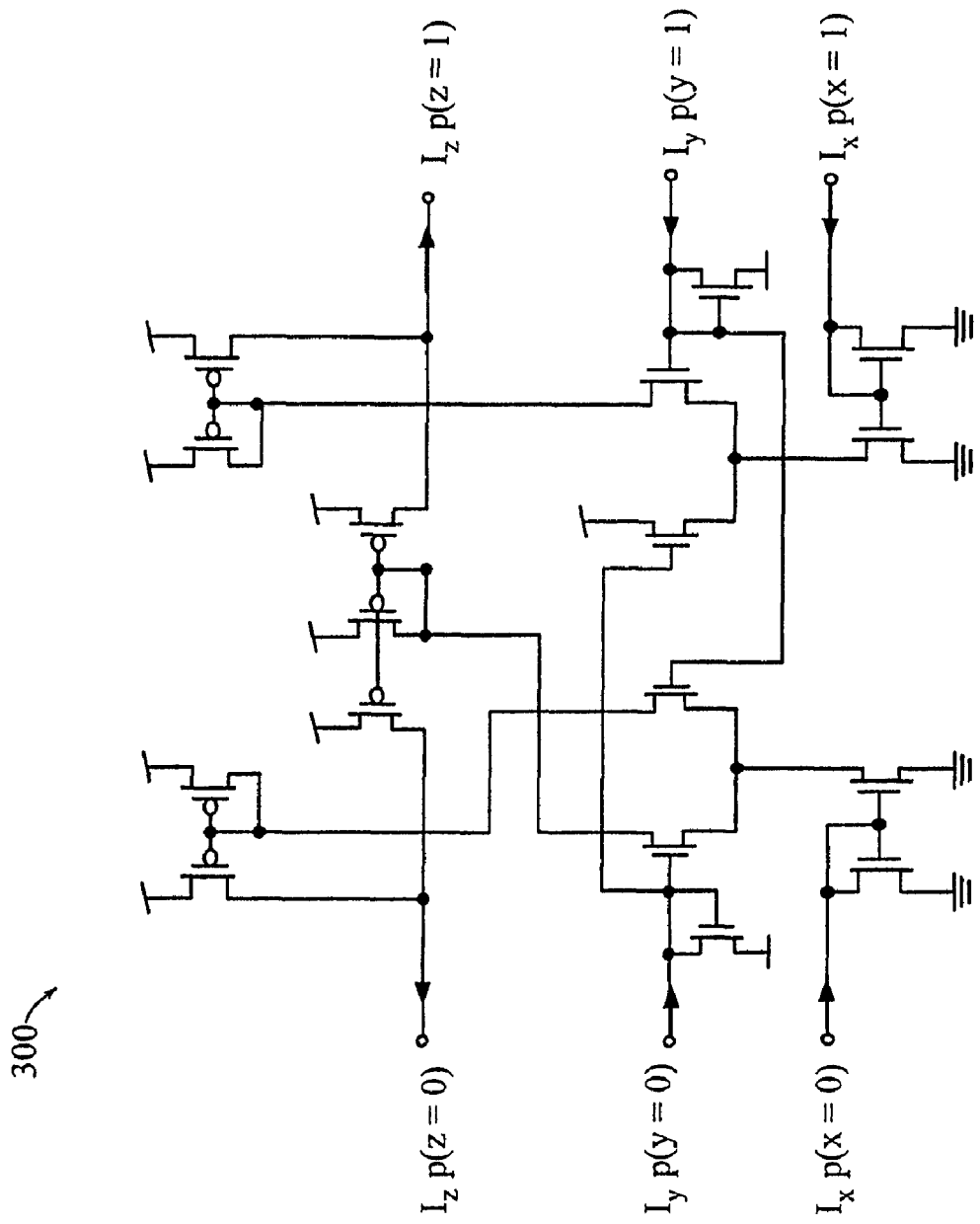
FIG. 3 schematically depicts an implementation of a soft equals gate.

Some embodiments of the invention also incorporate soft "equals" gates 300 as illustrated in FIG. 3.

The soft equals gate performs the function:

X Y Z $1\ 1 \rightarrow 1\ P_Z(1)=P_x(1) \times P_y(1)$ $0\ 0 \rightarrow 0\ P_Z(0)=P_x(0) \times P_y(0)$ $0\ 1 \rightarrow n/a$ $1\ 0 \rightarrow n/a$ In one embodiment, a soft equals gate is used to determine the probability that two signal components are equal.

As described in U.S. Pat. No. 6,282,559, the entire disclosure of which is hereby incorporated by reference, similar circuits can be used to model a wide range of functions corresponding or reducible to sum-product computations.

Figure 4:
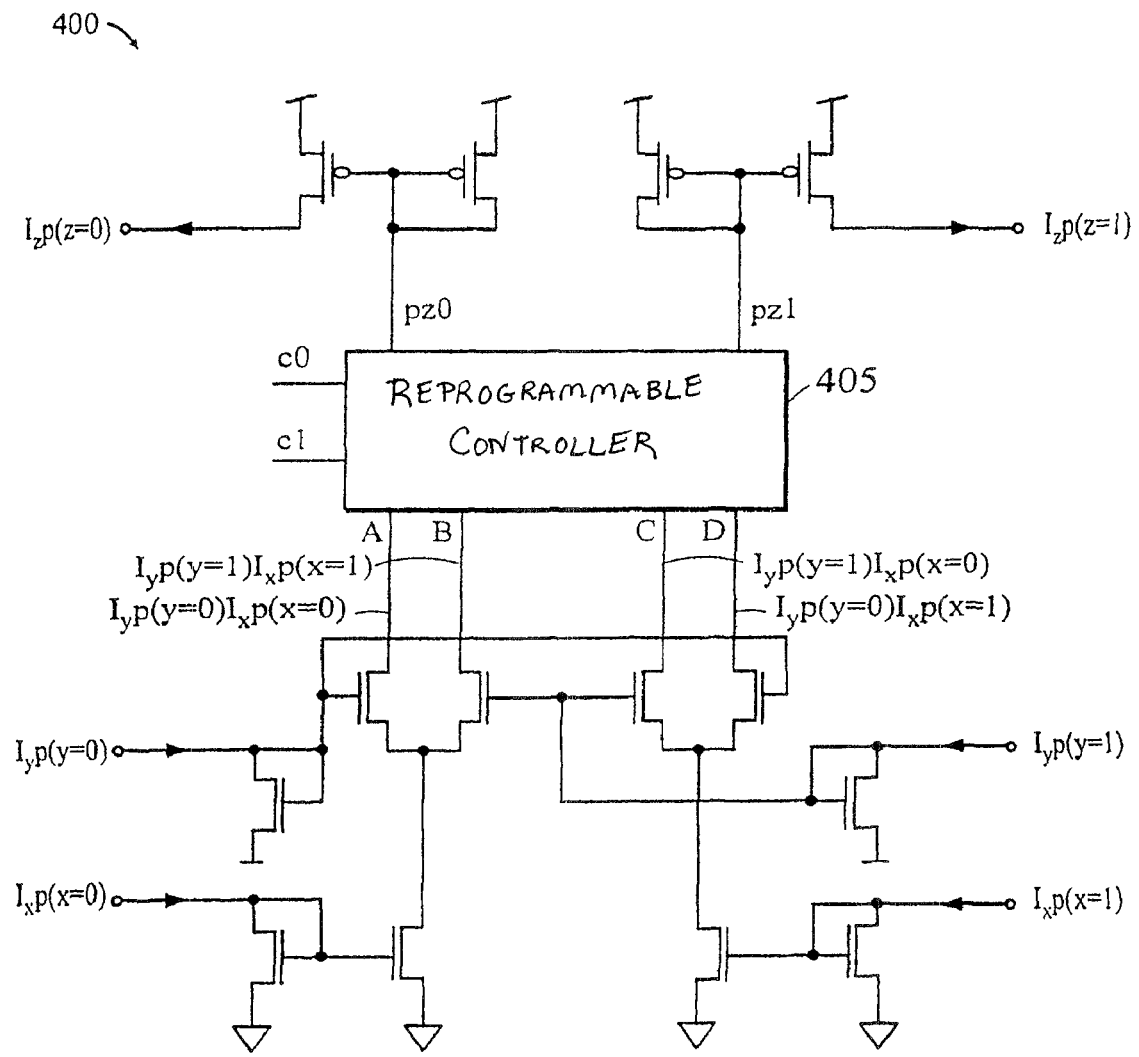
FIG. 4 schematically depicts an implementation of a reprogrammable soft gate.

Soft gates can be created such that the operation they implement can be dynamically reprogrammed, as depicted in FIG. 4. An exemplary reprogrammable soft gate 400 includes a reprogrammable controller 405, such as a field programmable gate array (FPGA), that takes as inputs signals A, B, C, and D representing $P_x(0)P_y(0)$, $P_x(1)P_y(1)$, $P_x(1)P_y(0)$, and $P_x(1)P_y(0)$, respectively, and control signals c0 and c1. The controller outputs $P_z(0)$ and $P_z(1)$ representing some linear combination of the input signals A, B, C, and D.

By varying the signals c0 and c1, the reprogrammable soft gate 400 can be dynamically reprogrammed to perform at least the following sample operations: OR, AND, and XOR. These operations may be described by the following equations:

| Control Inputs | Operation Performed | Output |
| --- | --- | --- |
| c0 = 0 | X AND Y | Pz(0) = A + C + D |
| c1 = 1 | | $P_z(1)$ = B |
| c0 = 0 | X OR Y | Pz(0) = A |
| c1 = 1 | | Pz(1) = B + C + D |
| c0 = 1 | X XOR Y | $P_z(0)$ = A + B |
| c1 = 1 | | $P_z(1)$ = C + D |

Of course, in other embodiments, reprogrammable soft gates can accept more or different inputs and additional control signals to provide for additional functionality and functionality selection.

Figure 5:
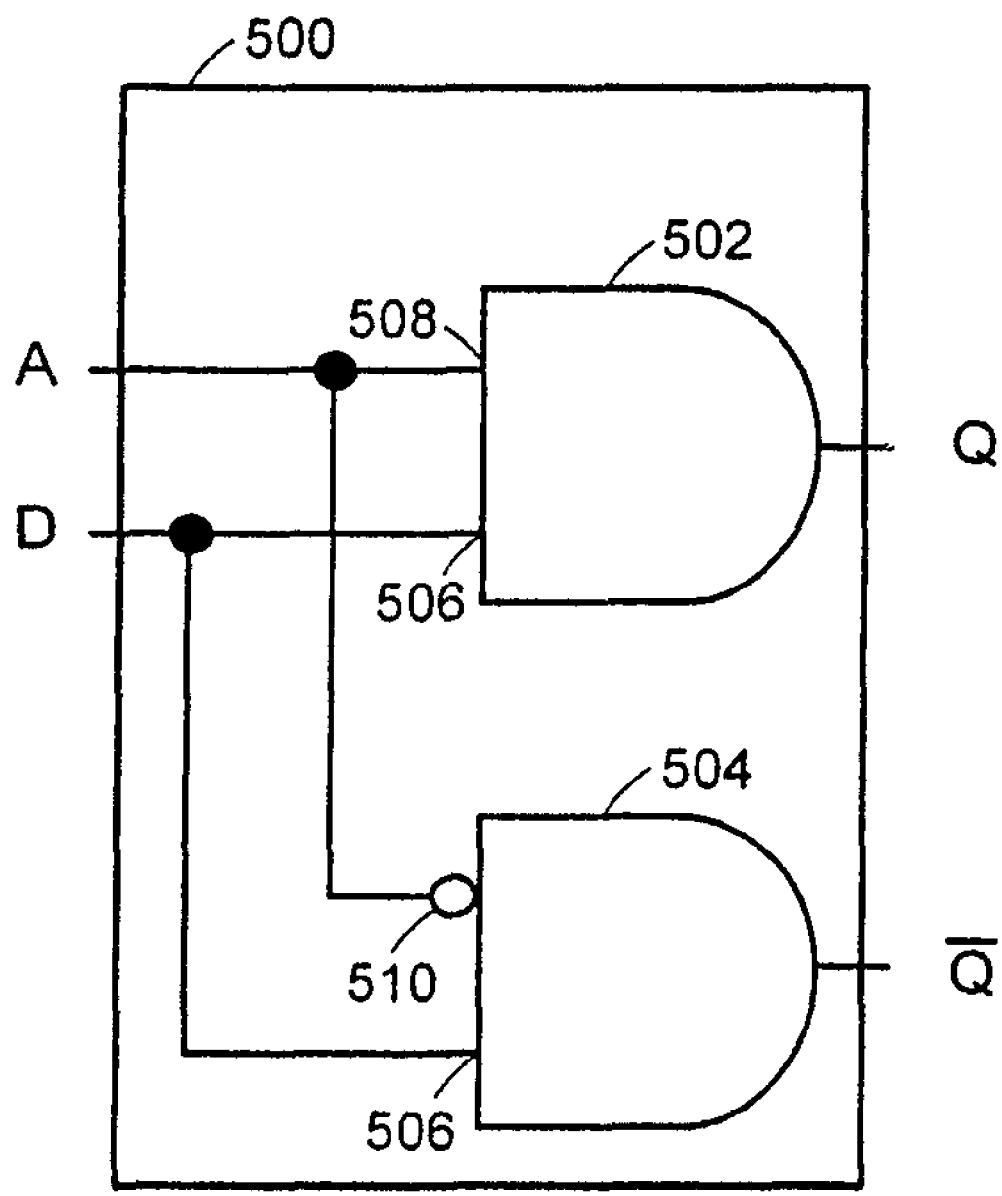
FIG. 5 schematically depicts an implementation of a soft one-bit multiplexer.

FIG. 5 is an illustrative soft one-bit multiplexer (SOM) 500 according to an embodiment of the invention. In digital logic, multiplexers provide routing functionality to direct digital signals to various other elements in a digital circuit. Soft multiplexers carryout a similar function for analog circuits.

The illustrative SOM 500 is the analog equivalent of a digital one-bit multiplexer, which receives as inputs an address signal and data. If the address signal corresponds to a 1, the data is transmitted to a first target. If the address signal corresponds to a 0, the data is transmitted to a second target.

The SOM 500 includes a data input D and an address input A. In one embodiment, the SOM is configured to accept two address input signals A1 and A2 corresponding to the p(A=1) and p(A=0) respectively. The data input D may also be configured to accept two data signals D1 and D2 corresponding to p(D=1) and p(D=2), respectively. The SOM 500 has two outputs Q and Q', each output transmitting a signal to a respective target.

The SOM 500 includes two soft AND gates configured for use in a soft multiplexer ("MAND" gates) 502 and 504. The first MAND gate 502 outputs Q to the first target, and the second MAND gate 504 outputs Q' to the second target. Both MAND gates 502 and 504 accept the data D as a first input 506. The first MAND gate 502 accpets A as a second input 508. The second MAND gate 504 accepts NOT A as a second input 510. For example, in a SOM embodiment that accepts address signals A1 and A2, each MAND gate 502 and 504 has two address input terminals x1 and x2. For the Q MAND gate 502, A1 is transmitted to the x1 terminal and A2 is transmitted to the x2 terminal. For the Q' MAND 504, A1 is transmitted to the x2 terminal and A2 is transmitted to the x1 terminal.

Figure 6:
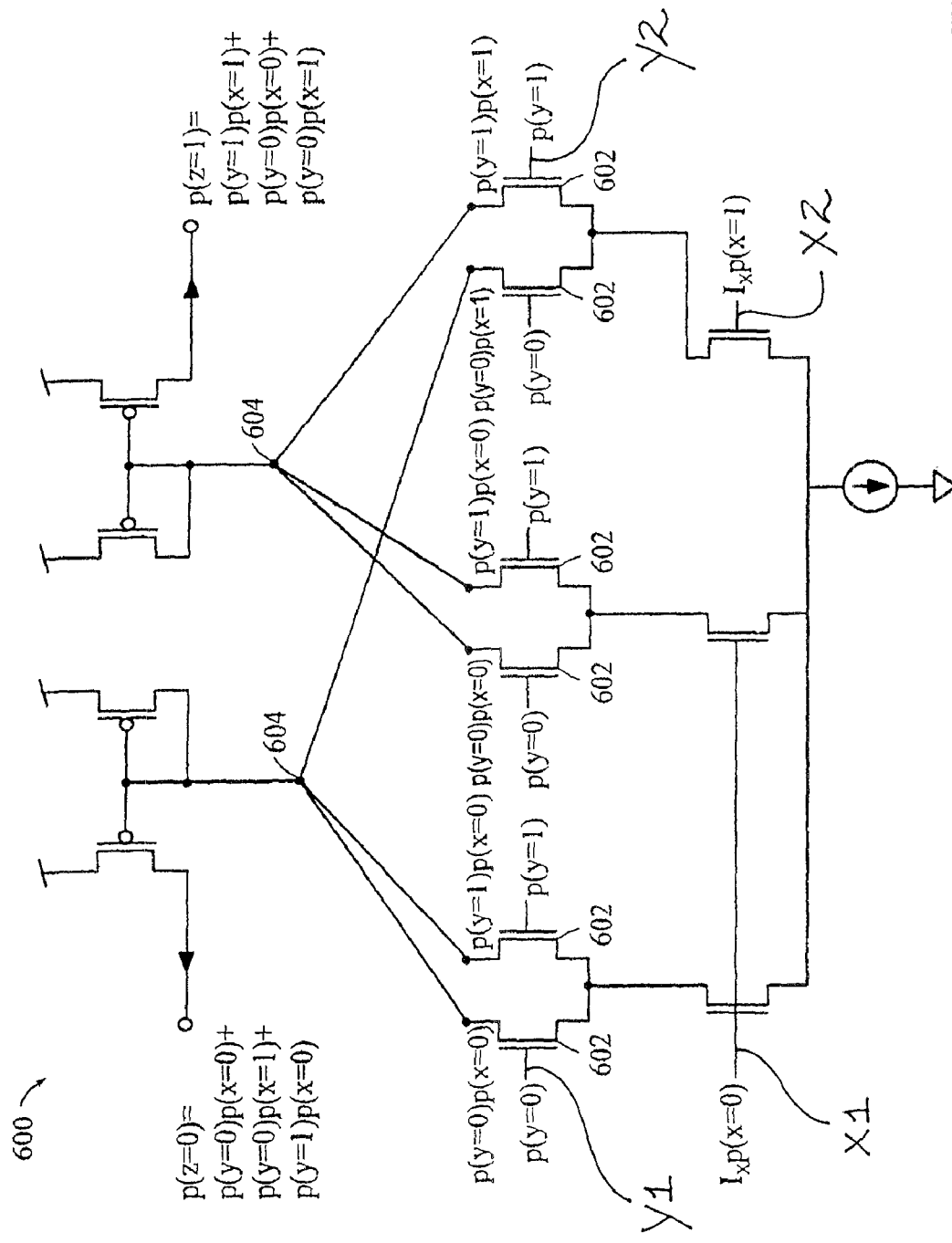
FIG. 6 schematically depicts an implementation of a MAND gate.

FIG. 6 is a schematic depiction of a MAND gate 600 (e.g., 502 or 504) according to one embodiment of the invention. The MAND gate 600 accepts inputs p(x=0), p(x=1), p(y=0), p(y=1) from terminals x1, x2, y1, and y2. As with the other soft gates described above, transistors 602 are used to multiply the inputs with one another and junctions 604 are used to add the resultant products. The illustrative MAND gate 600 outputs two values p(z=0) and p(z=1), corresponding to the following equations:

$$p_z(0)=p_y(0)p_x(0)+p_y(0)p_x(1)+p_y(1)p_x(0)$$

$$p_z(1)=p_y(1)p_x(1)+p_y(0)p_x(0)+p_y(0)p_x(1)$$

A SOM 500 designed using the illustrative MAND gate generates the following outputs:

$$p_Q(0)=p_D(0)p_A(0)+p_D(0)p_A(1)+p_D(1)p_A(0)$$

$$p_Q(1)=p_D(1)p_A(1)+p_D(0)p_A(0)+p_D(0)p_A(1)$$

$$p_{Q'}(0)=p_D(0)p_A(1)+p_D(0)p_A(0)+p_D(1)p_A(1)$$

$$p_{Q'}(1)=p_D(1)p_A(0)+p_D(0)p_A(1)+p_D(0)p_A(0)$$

That is, given that $p_A(1)=1$, the Q output corresponds to D and the Q' output corresponds to a probability of 0.5 (indicating no information). Similarly, if $p_A(1)=0$, the Q output corresponds to a probability of 0.5 and the Q' output corresponds to D.

In accordance with the present invention, continuous-time delay elements distribute delayed versions of analog waveforms. The sequence in which these signal portions are processed by computational elements and the connections therebetween may implement an algorithm. For example, analog filters may distribute different portions (typically different temporal portions) of a received signal to different soft gates. More generally, embodiments of the invention utilize analog filters for three purposes: removing high-frequency noise, allowing the components of the signal to simultaneously be analyzed in states that were received at separate distinct points in time, and synchronizing the system with a transmitting clock.

Analog filters are readily designed to implement a given delay. Just as filters can be tuned to allow various frequencies to pass, a filter's delay can also be tuned by adjusting its phase response function $\theta(\omega)$ (where the phase $\theta$ is a function of frequency $\omega$). A filter's delay, $\tau_d$, is equal to the negative first derivative of the filter's phase response function.

$$\tau_d = -\frac{d\theta(\omega)}{d\omega}$$

Figure 7:
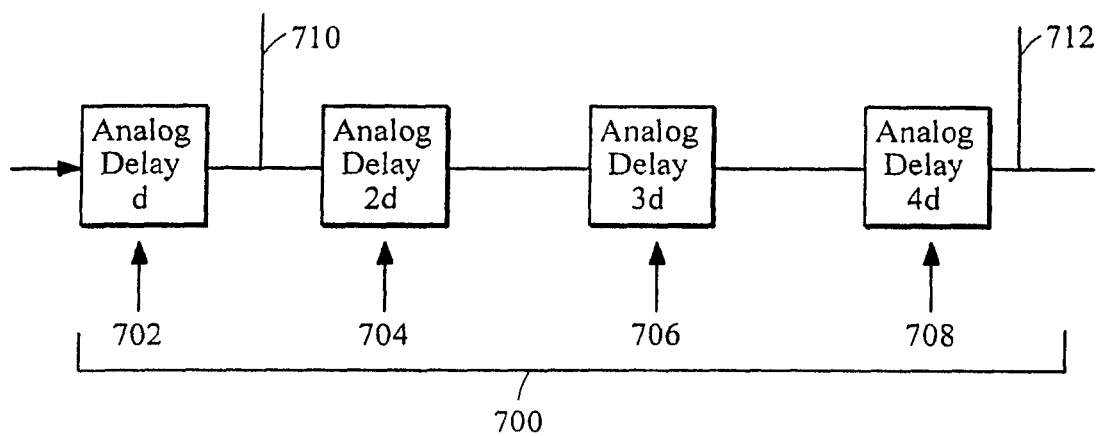
FIG. 7 depicts a train of analog filter delays.

A series of analog filters with delays equal to whole-number multiples of a period of time, d, behaves as a persistent memory with a state capacity equal to the number of filters in the series; that is, the series of filters acts in a similar fashion to digital shift register with a number of registers equal to the number of filters. For example, in FIG. 7, a signal propagates through a series of four filters generally indicated at 700. The first filter 702 imposes a delay, d, and the subsequent filters 704, 706, 708 impose delays of 2d, 3d, and 4d, respectively. By tapping the system between the first filter 702 and the second filter 704, and again after the fourth filter 708 at time t, the signal at the first tap 710 corresponds to the signal at time t-d, and the signal at the second tap 712 corresponds to the signal at time t-4d.

By combining soft logic gates and filters, embodiments of the invention can be built to mimic complex finite state machines (FSMs). One approach to implementing signal-processing, analysis, or coding/decoding functions in accordance with the invention is to represent the function as a FSM, and then implement the FSM using delay filters and soft gates cascaded so as to implement, in the correct order, the operations performed by the soft gates. For example, consider a coding system in which a message consisting of two bits, $m_1$ and $m_2$, is encoded into a three-bit message $c_1, c_2, c_3$ using the following constraints:

$m_1 \rightarrow c_1$ $m_2 \rightarrow c_2$ $c_1 \oplus c_2 = c_3$

Accordingly,

| $m_1$ | $m_2$ | $c_1$ | $c_2$ | $c_3$ |
|---|---|---|---|---|
| 0 | 0 | 0 | 0 | 0 |
| 0 | 1 | 0 | 1 | 1 |
| 1 | 0 | 1 | 0 | 1 |
| 1 | 1 | 1 | 1 | 0 |

The decoding function for a received message is:

$$\begin{bmatrix} 1 & 0 & 0 \\ 0 & 1 & 0 \end{bmatrix} \cdot \begin{bmatrix} c_1 \\ c_2 \\ c_3 \end{bmatrix}$$

Figure 8:
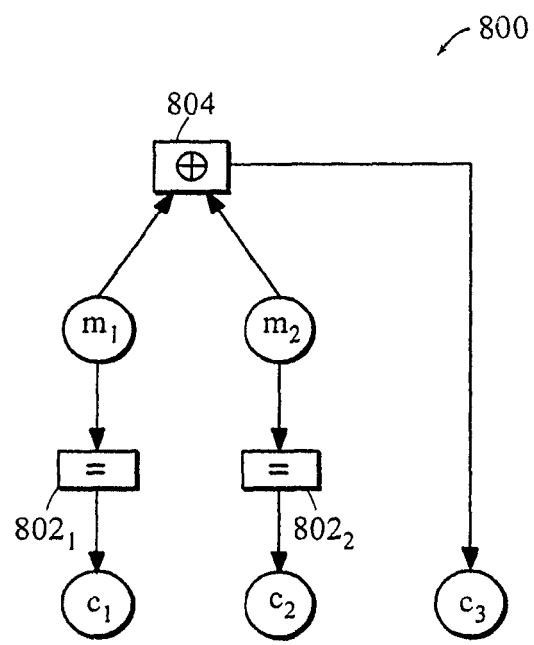
FIG. 8 depicts a finite state machine for encoding a message.

FIG. 8 depicts a flow diagram 800 of a FSM that implements the encoding function shown above. The message bits $m_1, m_2$ are each fed to an "equals" gate $802_1, 802_2$. The outputs of the equals gates $802_1, 802_2$ are the encoded bits $c_1$ and $c_2$. The message bits are also fed through an XOR gate 804 to obtain the third encoded bit $c_3$. The three message bits must arrive sequentially at the transmitter so they are sent in the correct order. Accordingly, if the input signal contains the sequence $m_1, m_2$, the signals are fed to gates $802_1, 802_2$ (implemented as soft gates) via filters imposing a first delay (which may be zero, or which may instead scale the input timing to a desired transmit timing) and to gate 804 through a filter imposing a second delay so that each of the encoded bits arrives for transmission at the proper time.

Figure 9:
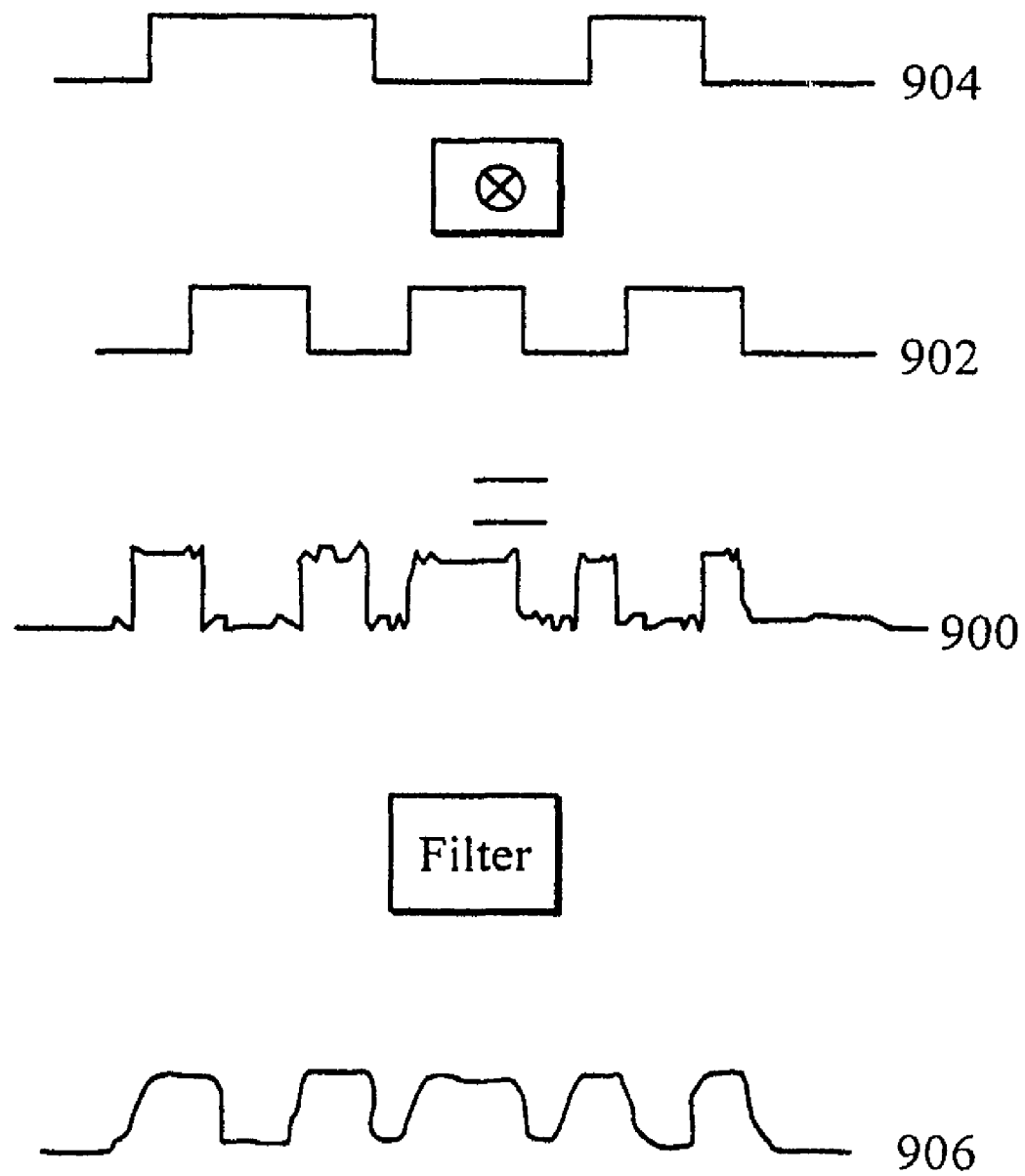
FIG. 9 depicts the synchronization effects of analog filters.

Embodiments of the invention also capitalize on the ability of delay elements with limited bandwidth to lend synchronization capability to the system. Much like the phenomenon of injection locking, the minimum energy state of the receiver system occurs when the receiver is synchronized to the transmitter. As unsynchronized bitstreams are processed by soft gates, steady signals interact with bit edges. These interactions create high-frequency noise on both sides of the manipulated bits. FIG. 9 illustrates, at 900, the approximate results of a soft XOR applied to two unsynchronized signals 902, 904. Low-pass filters eliminate that noise and as a result synchronize the two bitstreams, as shown at 906.

Figure 10:
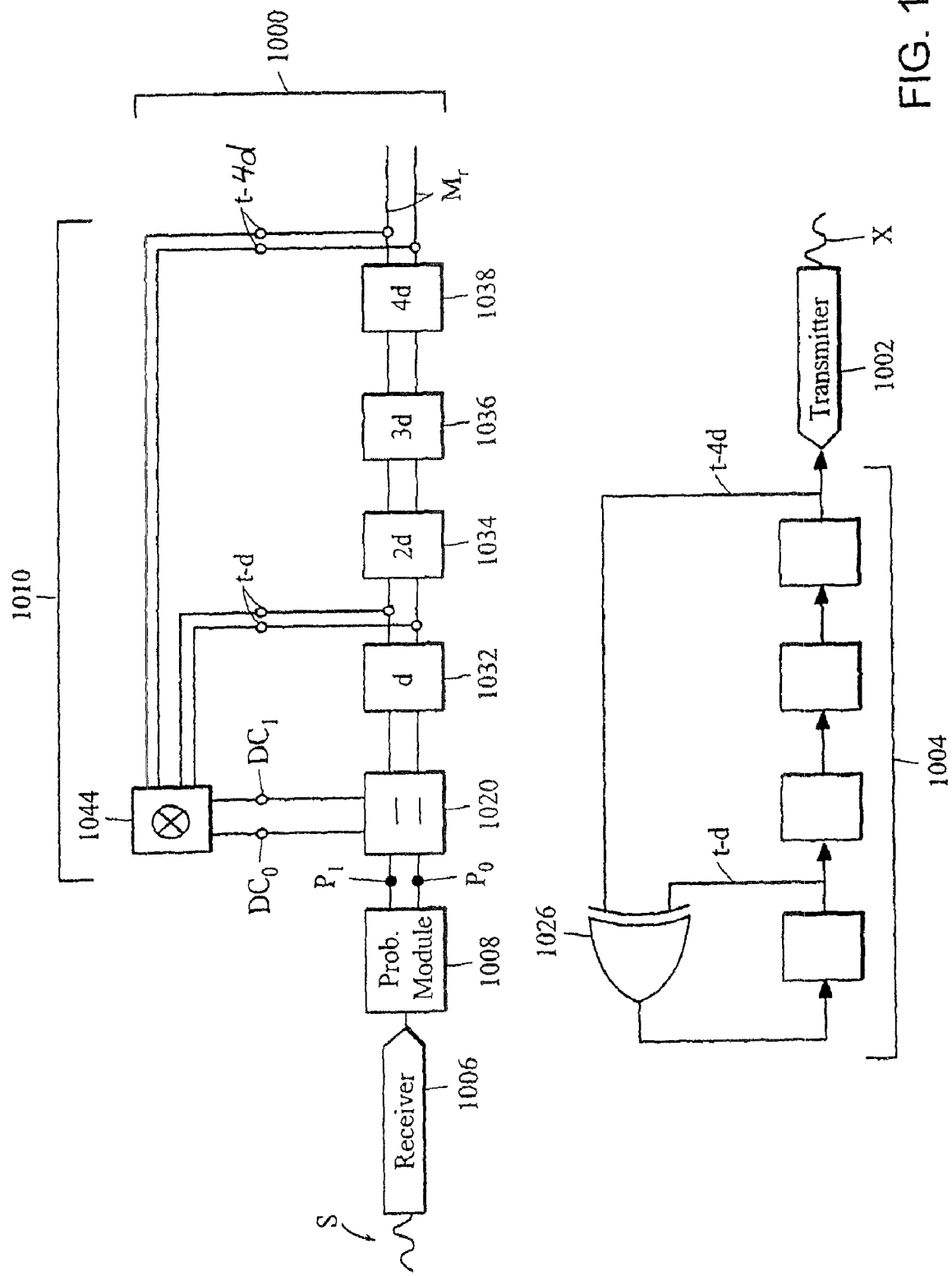
FIG. 10 schematically depicts a spread spectrum transmitter and its corresponding receiver implemented with a noise lock loop.
Figure 11:
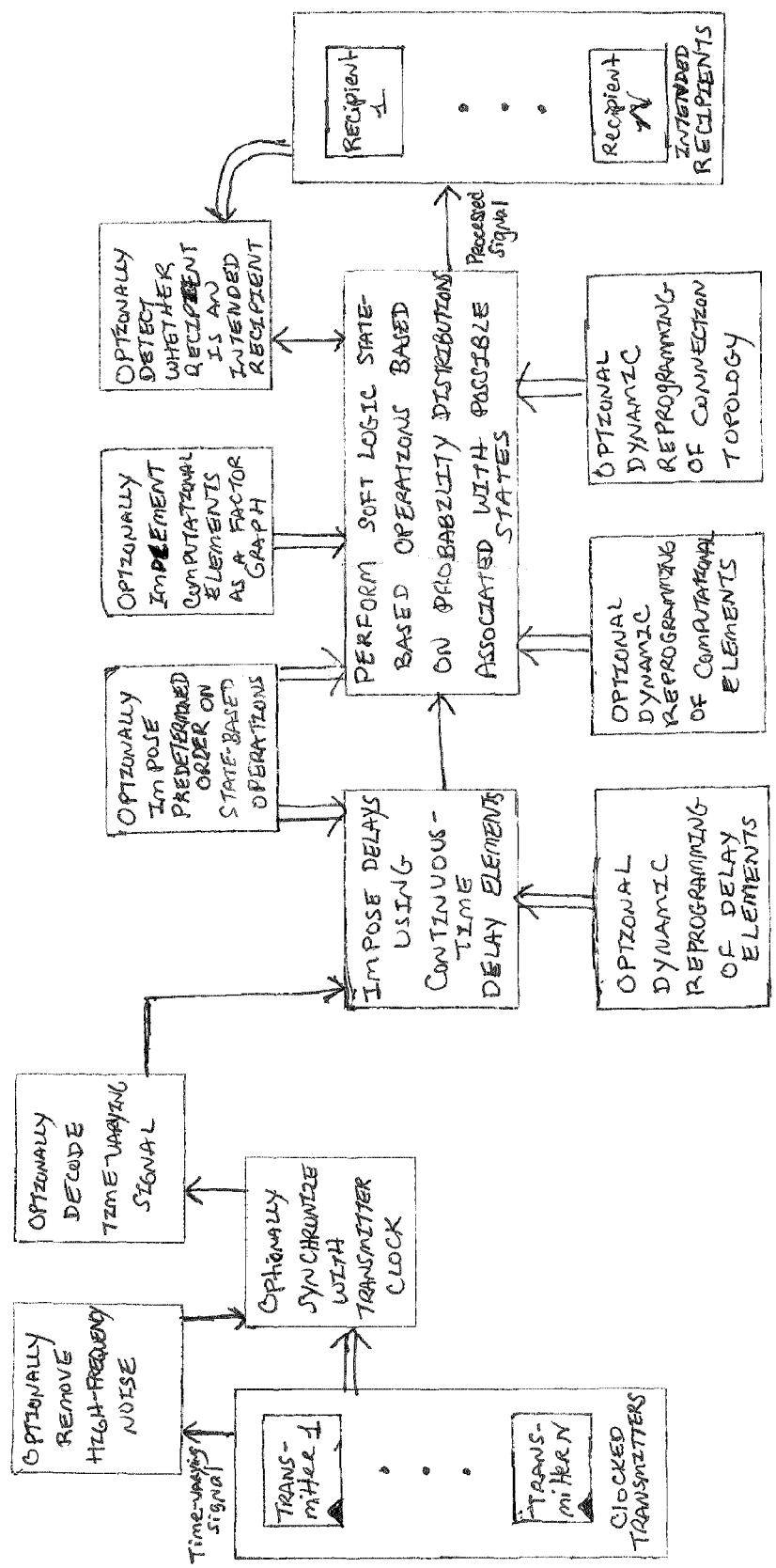
FIG. 11 is a generalized operational schematic depicting steps and components utilizable in the method of the invention.

Synchronization is highly useful, for example, in decoding and signal-acquisition applications. One embodiment of the invention incorporating a FSM is a "noise lock loop" 1000 (FIG. 10). The loop 1000 can be used to acquire, decode, and track a spread spectrum communication.

A spread spectrum transmitter 1002 sends a signal, to at least one of a plurality of users, that is the result of modulating a message, $M_t$, by a stream of bits created by a pseudo-random number generator 1004. The modulation performs a coding function. A user's spread spectrum receiver performs multi-user detection by only recovering messages that are sent using that receiver's particular modulation code. The receiver requires an exact copy of the transmitter's modulation code, which only the intended user or users have, in order to recover the message transmitted by the sender.

The value of outputted bits from the pseudo-random noise generator 1004 may depend on states of the stream that exist at other points in time. An algorithm can model that dependency. Whatever algorithm is used to generate the pseudo-random stream of bits, the algorithm can be modeled as a FSM. When the spread spectrum signal is received, a factor graph corresponding to the transmitter's FSM can be used to demodulate and decode the received signal to recover the transmitted message.

The noise lock loop 1000 is such a demodulating FSM. The noise lock loop comprises a receiver 1006, a probability module 1008, a decoding FSM 1010, and a series of delay elements (e.g., filters) and soft logic gates (described below) that perform demodulation.

The noise lock loop 1000 receives a signal S comprising a distorted signal X that is intended to be received by at least one of a plurality of users. The distortion is caused by noise in the communication channel. X further comprises the result of modulating a transmitted message $M_t$ with a code, the code being chosen to select users as intended recipients. X and $M_t$ are time-varying signals comprising signal components, $x_i$ and $m_{ti}$, representing digital bits. The loop utilizes a guess of the signal, X, which the sender originally intended S to be. Eventually the loop 1000 outputs either noise, if the loop does not correspond to an intended user recipient, or the received message $M_r$, if the loop corresponds to an intended user recipient. In order to recover $M_r$, the noise lock loop 1000 synchronizes itself with the transmitter 1002, estimates the value of components of the received signal S, and demodulates the signal S.

The receiver 1006 receives S and passes it to the probability module 1008. Based on S and knowledge of the noise characteristics of the channel, the probability module 1008 outputs the probability signals, $P_0$ and $P_1$. $P_0$ and $P_1$ are defined as the respective probabilities that a transmitted signal component $x_i$ is either 0 or 1, given that the receiver received $s_i$ such that:

$$P_{0,i}=P(x_i=0|s_i)$$

$$P_{1,i}=P(x_i=1|s_i)$$

$$P_{0,i}+P_{1,i}=1.$$

The probability module outputs $P_0$ and $P_1$ into the decoding FSM 1010. The decoding FSM 1010, which includes a decoding portion and a feedback portion, synchronizes the system with the transmitter 1002, eliminates high-frequency noise in S and Y, and further guesses the value of signal components $M_{r,i} \ldots M_{r,m}$ In one embodiment of the noise lock loop 1000, the first element in the decoding FSM 1010 is a soft equals gate 1020. The soft equals gate 1020 is the feedback portion of the decoding FSM 1010. The gate 1020 receives new input, $P_0$ and $P_1$, from the probability module 1008 and feedback signals, $DC_0$ and $DC_1$, from the decoding portion of the decoding FSM. $DC_0$ and $DC_1$ are the outputs from the decoding portion of the decoding FSM 1010. $DC_0$ and $DC_1$ are defined as the expected probabilities that the next bit will be 0 and 1, respectively, based on guesses of the values of signal components at other points in time.

If the modulation code of the transmitter 1002 matches the demodulation code of the decoding FSM 1010, through the feedback mechanism the outputs of the soft equals gate 1020 settle toward 0 and 100%. If the codes differ, the output of the soft equals gate 1020 will not settle and no message will be received. The output of the soft equals gate 1020 propagates through the analog filters 1032, 1034, 1036, 1038, and eventually becomes the output of the noise lock loop 1000.

More specifically, the soft equals gate 1020 outputs its results into the first of a series of analog filter delays 1032. The number of delays utilized in a particular application depends on the number of distinct states in time that the decoding algorithm needs to analyze in order to perform its functions. Each filter has a delay factor equal to a whole-number multiple of the transmitter's clock rate. The filters have a cutoff frequency set just below the clock rate of the transmitter 1002. As mentioned above, filters perform three separate roles in embodiments of the invention. The filters allow multiple, temporally disparate components of the signal to be simultaneously examined. The filters also remove signal components that have frequencies higher than the clock rate of the transmitter (i.e., noise), and work to synchronize the system with the clock of the transmitter.

The remainder of the soft gates in the decoding portion 1010 of the noise lock loop 1000 generate $DC_0$ and $DC_1$ by simultaneously performing logic operations on temporally distinct components of the guessed output signal, each component being drawn from the output of a particular filter. For example, the illustrated decoding portion 1010 of the noise lock loop 1000 decodes the signal modulated by the digital pseudo-random number generator 1004. The output of pseudo-random number generator 1004 at time t is equal to the XOR of the output of pseudo-random number generator 1004 at times t-d and t-4d.

The analog filters in the illustrated noise lock loop 1000 have delay factors equal to d, 2d, 3d, and 4d. The series of filters is tapped after the first filter 1032 and after the fourth filter 1038. The taps carry signal components corresponding to probabilities of guesses of the message components at times t-d and t-4d to a soft XOR gate 1044, generating the probability signals $DC_0$ and $DC_1$ described above.

Finally, tapping the noise lock loop 1000 after its last delay 1038 provides the output, $M_r$. The signal carried on the filter output equivalent to the probability that the signal is a one should closely resemble the bitstream $M_r$.

Those skilled in the art will recognize that the invention can be utilized to implement a large variety of signal-processing, analysis, and decoding circuits. For instance, the invention may be used to perform statistical estimation, for example in radio front-ends. In other exemplary embodiments, the invention can derive statistics from baseband, IF, or carrier signals. These statistics can be used to perform tasks such as interference rejection, multiple user detection, decoding, and error correction decoding, interference cancellation, carrier tracking, parameter tuning for filters, gain estimation for automatic gain control, transmitter modeling, environmental modeling, channel modeling, and channel equalization.

The invention's statistical estimation ability further allows for embodiments to be incorporated into imaging, measurement, or range-finding devices such as nuclear magnetic resonance devices, radar, and ultrasounds. The invention would perform interference rejection, interference cancellation, multiple user decoding, error correction decoding, carrier tracking, parameter tuning for filters, automatic gain control, transmitter modeling, environmental modeling, channel modeling, and/or channel equalization functions.

The invention may also be used for timing recovery and synchronization in ultra-wide-band applications. For example, the invention may be used to implement a novel approach to radio communication transceiver design that may be termed "sequence shift keying" (SSK). An SSK radio can be built without phase lock loops for performing timing recovery in the receiver. In an SSK radio, the transmitter is implemented as an encoder that outputs bits with spectral characteristics matched to the channel transfer function. The received signal is passed directly into a system of filters and soft gates, in accordance with the invention, which implements timing recovery, demodulation and decoding by combining entrainment with statistical estimation. Alternatively, a conventional radio front-end may be combined with a SSK approach so that the transmitted base-band signal is up-converted by mixing it with a conventional sinusoidal carrier for transmission in the channel, and then down-converted by conventional methods in the receiver. The SSK block may perform multi-user decoding, error correction decoding, and/or decompression operations.

Embodiments of the invention can also provide synchronization for signals propagating through high-speed computers. In addition, embodiments of the invention can replace the A/D converters that PC motherboards use to remove inter-symbol interference introduced within the computer's bus, allowing for higher processing speeds. Indeed, the invention may obviate the need for clocks in large asynchronous logic systems.

The invention's ability to replace digital systems that implement probabilistic graphical models, such as Hidden Markov Models and Markov Random Fields, allows for design of faster and more accurate voice and vision pattern recognition devices.

The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. A method for transforming, in a signal processing system, a received time-varying signal into a processed signal, the method comprising the steps of:
   imposing a plurality of delays on the received time-varying signal, wherein the delays are imposed by continuous-time delay elements; and
   performing soft logic state-based operations on a plurality of delayed components of the time-varying signal based on probability distributions associated with different possible states thereof to obtain the processed signal.

2. The method of claim 1 further comprising the step of propagating the processed signal within an electronic device or through a propagation medium.

3. The method of claim 1 wherein the time-varying signal is expressed as a probabilistic representation.

4. The method of claim 1 wherein the delays cause a plurality of temporally distinct signal components to be operated on simultaneously.

5. The method of claim 1 wherein at least some of the delays conserve the amplitude of the signal components.

6. The method of claim 1 further comprising the step of removing high-frequency noise from the time-varying signal.

7. The method of claim 1 wherein (i) the time-varying signal has one of a plurality of users as intended recipients, (ii) the time-varying signal is transmitted from one of a plurality of transmitters, each transmitter having a clock rate, (iii) the time-varying signal is received by one of the plurality of users and (iv) the state-based operations detect whether the user receiving the time-varying signal is an intended recipient.

8. The method of claim 1 wherein the state-based operations perform a series of probability computations on the time-varying signal components in a predetermined order, the predetermined order being enforced by the delays.

9. The method of claim 8 wherein the time-varying signal represents an encoded message and wherein the time-varying signal is produced by a transmitter having a clock rate, and further comprising the steps of:
   removing high-frequency noise from the time-varying signal;
   synchronizing with the transmitter's clock; and
   decoding the time-varying signal.

10. The method of claim 1 wherein the state-based operations correspond to an algorithm.

11. The method of claim 10 wherein the algorithm is a belief propagation algorithm, a statistical estimation algorithm, or a decoding algorithm.

12. The method of claim 10 wherein the algorithm performs multi-user detection.

13. The method of claim 10 wherein the algorithm implements a factor graph.

14. A method for transforming, in a signal processing system, a received time-varying signal into a processed signal, the method comprising the steps of:
   imposing a plurality of delays on the received time-varying signal, wherein the delays are imposed by continuous-time delay elements and wherein at least some of the delay elements are soliton delay elements, filters, or lump delay circuits; and
   performing state-based operations on a plurality of delayed components of the time-varying signal based on probability distributions associated with different possible states thereof to obtain the processed signal.

15. The method of claim 14 further comprising the step of propagating the processed signal within an electronic device or through a propagation medium.

16. The method of claim 14 wherein at least some of the delays are imposed by filters and at least some of the filters are low-pass filters, band-pass filters, or linear phase filters.

17. A method for transforming, in a signal processing system, a received time-varying signal into a processed signal, the method comprising the steps of:
   imposing a plurality of delays on the received time-varying signal, wherein the delays are imposed by continuous-time delay elements and wherein at least some of the delays arise from bandwidth limitations of the computational elements or of connections between the computational elements; and
   performing state-based operations on a plurality of delayed components of the time-varying signal based on probability distributions associated with different possible states thereof to obtain the processed signal.

18. The method of claim 17 further comprising the step of propagating the processed signal within an electronic device or through a propagation medium.

19. A method for transforming, in a signal processing system, a time-varying signal into a processed signal, the method comprising the steps of:
   a. receiving the time-varying signal, wherein the time-varying signal is produced by a transmitter having a clock rate;
   b. synchronizing with the transmitter's clock; and
   c. imposing a plurality of delays on the time-varying signal, wherein the delays are imposed by continuous-time delay elements; and
   d. performing state-based operations on a plurality of delayed components of the time-varying signal based on probability distributions associated with different possible states thereof to obtain the processed signal.

20. The method of claim 19 further comprising the step of propagating the processed signal within an electronic device or through a propagation medium.

21. The method of claim 19 wherein the time-varying signal is encoded by the transmitter, and further comprising the steps of:
   e. removing high-frequency noise from the time-varying signal; and
   f. decoding the time-varying signal.

22. The method of claim 21, wherein the state-based operations perform a series of probability computations on the time-varying signal components in a predetermined order, the predetermined order being enforced by the delays.

23. A method of dynamically transforming a signal processor into a reprogrammed signal processor, the signal processor having a plurality of dynamically reprogrammable analog computational elements that perform soft logic state-based probabilistic computations based on probability distributions associated with the different possible states of a received time-varying signal, wherein the computational elements are dynamically reprogrammable to carry out any of a plurality of computational operations, the method comprising the step of reprogramming the signal processor by dynamically reprogramming the probability operations performed by at least some of the dynamically reprogrammable computational elements to obtain the reprogrammed signal processor.

24. The method of claim 23 further comprising the steps of:
   a. processing a signal using the reprogrammed signal processor; and
   b. propagating the processed signal within an electronic device or through a propagation medium.

25. The method of claim 23 further comprising the step of altering the delays of a plurality of dynamically reprogrammable analog delay elements in operative communication with the dynamically reprogrammable computational elements, wherein the analog delay elements are dynamically reprogrammable to impose any of a plurality of delays.

26. A method of dynamically transforming a signal processor into a reprogrammed signal processor, the signal processor having a plurality of continuous-time computational elements that perform probabilistic computations and which are connected in accordance with a dynamically reprogrammable connection topology, the method comprising the step of reprogramming the signal processor by dynamically reprogramming the connection topology to obtain the reprogrammed signal processor.

27. The method of claim 26 further comprising the steps of:
 a. processing a signal using the reprogrammed signal processor; and
 b. propagating the processed signal within an electronic device or through a propagation medium.

28. A method of factor-graph analysis for transforming, in a signal processor, a plurality of signal components into a processed signal, the method comprising the steps of:
 a. storing in a series of continuous-time delay elements the plurality of signal components, the signal components representing values;
 b. presenting the signal components to inputs of a circuit implementing a factor graph; and
 c. processing the signal components using the circuit implementing the factor graph to obtain the processed signal.

29. The method of claim 28 further comprising the step of propagating the processed signal within an electronic device or through a propagation medium.

* * * * *